(12) United States Patent
Loopstra et al.

(10) Patent No.: US 8,174,671 B2
(45) Date of Patent: *May 8, 2012

(54) LITHOGRAPHIC PROJECTION APPARATUS AND METHOD FOR CONTROLLING A SUPPORT STRUCTURE

(75) Inventors: Erik Roelof Loopstra, Heeze (NL); Emiel Jozef Melanie Eussen, Eindhoven (NL); Willem Herman Gertruda Anna Koenen, Roermond (NL); Engelbertus Antonius Fransiscus Van Der Pasch, Oirschot (NL); Marc Wilhelmus Maria Van Der Wijst, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 636 days.

This patent is subject to a terminal disclaimer.

(21) Appl. No.: 12/142,271

(22) Filed: Jun. 19, 2008

(65) Prior Publication Data

US 2008/0319569 A1     Dec. 25, 2008

Related U.S. Application Data

(63) Continuation-in-part of application No. 11/812,817, filed on Jun. 21, 2007, now Pat. No. 7,804,579.

(51) Int. Cl.
*G03B 27/42* (2006.01)
*G03B 27/58* (2006.01)
*G03B 27/32* (2006.01)
*G01B 11/14* (2006.01)
*G01B 11/00* (2006.01)

(52) U.S. Cl. .............. 355/53; 355/72; 355/77; 356/400; 356/616

(58) Field of Classification Search .................... 355/53, 355/72, 77; 356/399, 400, 401, 614–623
See application file for complete search history.

(56) References Cited

U.S. PATENT DOCUMENTS

| 5,751,404 | A | 5/1998 | Murakami et al. |
| 6,819,425 | B2 | 11/2004 | Kwan |

(Continued)

FOREIGN PATENT DOCUMENTS

| EP | 1 126 323 A2 | 8/2001 |
| JP | 2001-308003 A | 11/2001 |
| JP | 2002-151405 A | 5/2002 |
| JP | 2002-367878 A | 12/2002 |
| JP | 2003-22948 A | 1/2003 |
| JP | 2005-331542 A | 12/2005 |
| JP | 2007-071874 A | 3/2007 |

OTHER PUBLICATIONS

Search Report and Written Opinion mailed Oct. 28, 2008 for European Application No. 08158686.9-2222, 9 pgs.

(Continued)

*Primary Examiner* — Glen Kao
(74) *Attorney, Agent, or Firm* — Sterne, Kessler, Goldstein & Fox P.L.L.C.

(57) ABSTRACT

A control system controls a support structure of a lithographic apparatus. A first measurement system measures the position of a substrate supported by the support structure, in a first coordinate system. A second measurement system measures the position of the support structure in a second coordinate system, the first measurement system having a presumed position in the second coordinate system. A controller controls the position of the support structure based on measurements by the second measurement system, to convert the measured position of the substrate into a converted position of the support structure in the second coordinate system, to position the support structure based on the converted position, to receive a position error signal indicative of a difference between the presumed position and an actual position of the first measurement system in the second coordinate system, and to position the support structure dependent upon the position error signal.

38 Claims, 6 Drawing Sheets

U.S. PATENT DOCUMENTS

Figure 1:
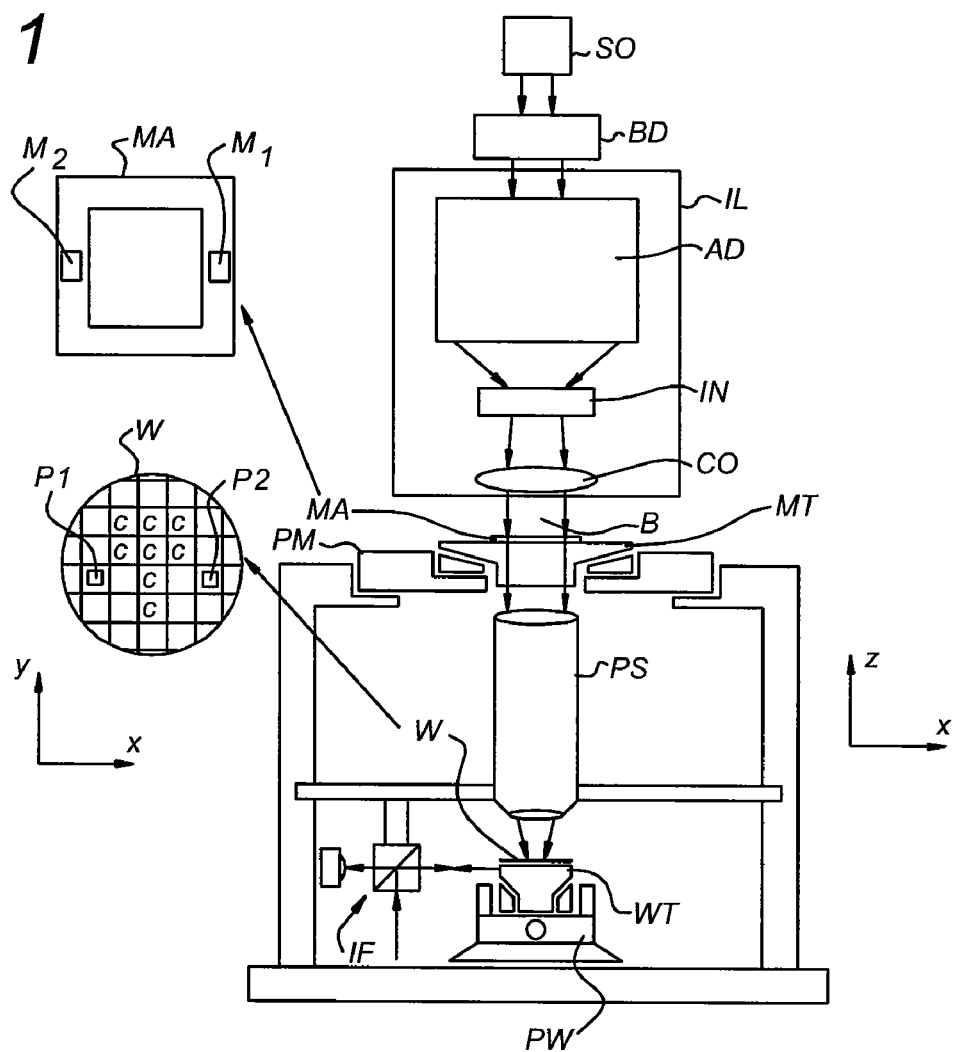

| | | |
|---|---|---|
| 7,126,689 B2 | 10/2006 | Nishi |
| 7,348,574 B2 | 3/2008 | Pril et al. |
| 7,804,579 B2 * | 9/2010 | Loopstra et al. ............. 355/53 |
| 2001/0028456 A1 | 10/2001 | Nishi |
| 2002/0001082 A1 | 1/2002 | Akimoto et al. |
| 2002/0149754 A1 | 10/2002 | Auer et al. |
| 2004/0211921 A1 | 10/2004 | Castenmiller et al. |
| 2004/0263846 A1 | 12/2004 | Kwan |
| 2006/0227309 A1 | 10/2006 | Loopstra et al. |
| 2007/0052976 A1 | 3/2007 | Pril et al. |

OTHER PUBLICATIONS

Schaffel et al. "Integrated electro-dynamic multicoordinate drives," Proc. ASPE Annual Meeting, California, USA, 1996, pp. 456-461.

Loopstra et al., "Control System, Lithographic Projection Apparatus, Method of Controlling a Support Structure, and a Computer Program Product" U.S. Appl. No. 11/812,817, filed Jun. 21, 2007.

Swedish Search Report for Application No. SE 2008 01130 mailed May 6, 2008, 4 pgs.

English Translation of JP 2003-022948, published Jan. 24, 2003, 15 pgs.

Non-Final Rejection mailed Apr. 21, 2010 for U.S. Appl. No. 11/812,817, filed Jun. 21, 2007.

English-Language Abstract for JP 2001-308003 A, published Nov. 2, 2001; 1 page.

English-Language Abstract for JP 2002-151405 A, published May 24, 2002; 1 page.

English-Language Abstract for JP 2007-071874 A, published Mar. 22, 2007; 1 page.

English-Language Translation of Notice of Reasons for Rejection, directed to related Japanese Patent Application No. 2008-162270, mailed on Jan. 27, 2011, Japanese Patent Office; 3 pages.

* cited by examiner

LITHOGRAPHIC PROJECTION APPARATUS AND METHOD FOR CONTROLLING A SUPPORT STRUCTURE

CROSS REFERENCE TO RELATED APPLICATIONS

This application is a Continuation-In-Part of U.S. patent application Ser. No. 11/812,817 titled "Displacement Measurement Between Alignment Module and Stage Position Measurement Gridframe, part of Encoder System," filed Jun. 21, 2007 (now U.S. Pat. No. 7,804,579) naming the same inventors as above, and incorporated by reference herein in its entirety.

BACKGROUND OF THE INVENTION

The present invention relates to structures, methods and programs for controlling a support structure in a lithographic apparatus.

A lithographic apparatus applies a desired pattern onto a substrate, usually onto a target portion of the substrate. A lithographic apparatus can be used, for example, in the manufacture of integrated circuits (ICs). For example, a patterning device, also referred to as a mask or a reticle, may be used to generate a circuit pattern to be formed on an individual layer of the IC. Such a pattern can be transferred onto a target portion (e.g., comprising a part of, one, or several dies) on a substrate (e.g., a silicon wafer). The pattern is typically transferred by imaging the pattern onto a layer of radiation-sensitive material (e.g. a "resist") provided on the substrate. In general, a single substrate will contain a network of adjacent target portions that are successively patterned. Conventional lithographic apparatus include so-called "steppers", in which each target portion is irradiated by exposing an entire pattern onto the target portion at one time, and so-called "scanners", in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

One of the challenging requirements in micro-lithography for the production of integrated circuits as well as liquid crystal display panels is the positioning of structures with respect to each other. For example, sub-100 nm lithography demands substrate-positioning and mask-positioning stages with dynamic accuracy and matching between machines in the order of 1 nm in 6 degrees of freedom (DOF), at velocities up to 3 m/s.

A conventional approach for achieving such demanding positioning requirements is to sub-divide the stage positioning architecture into a coarse positioning module (e.g. an X-Y table or a gantry table), onto which a fine positioning module is cascaded. The coarse positioning module has a micrometer accuracy. The fine positioning module is responsible for correcting for the residual error of the coarse positioning module to the last few nanometers. The coarse positioning module covers a large working range, while the fine positioning module only needs to accommodate a very limited range of travel. Commonly used actuators for such nano-positioning modules include piezoelectric actuators or voice-coil type electromagnetic actuators. While positioning in the fine module is usually effected in six degrees of freedom (DOF), large-range motions are rarely required for more than two DOF, thus easing the design of the coarse module considerably.

The micrometer accuracy required for the coarse positioning can be readily achieved using relatively simple position sensors, such as optical or magnetic incremental encoders. These can be single-axis devices with measurement in one DOF, or more recently multiple (up to 3) DOF devices such as those described by Schäffel et al. "Integrated electro-dynamic multicoordinate drives", Proc. ASPE Annual Meeting, California, USA, 1996, p. 456-461. Similar encoders are also available commercially, e.g., position measurement system Type PP281R manufactured by Dr. J. Heidenhain GmbH of Traunreut, Germany.

Position measurement for mask and substrate tables at the end of the fine positioning module, on the other hand, has to be performed in 6 DOF to sub-nanometer resolution, with nanometer accuracy and stability. This is commonly achieved using multi-axis interferometers to measure displacements in all 6 DOF, with redundant axes for additional calibration functions (e.g. calibrations of interferometer mirror flatness on the substrate table).

As an alternative for interferometers, optical encoders can be used, optionally in combination with interferometers. Such optical encoders are, for instance, disclosed in U.S. Patent Application Publication No. 2004/0263846 A1 titled "Lithographic Apparatus, Device Manufacturing Method, and Device Manufacturing thereby" of Kwan, which is hereby incorporated herein by reference. In Kwan, optical encoders use a grid pattern on one or more grid plates to determine their position with respect to the grid pattern. The optical encoders are mounted on the substrate table, while the grid plate is mounted on a frame of the lithographic apparatus. As a result, the location of the substrate table is with respect to the grid plate can be inferred.

With continued efforts to image ever smaller patterns to create devices with higher component densities, while increasing the number of patterns manufactured per unit time, opto-electro-mechanical processes within the lithographic apparatus need to be performed faster leading to vibrations of the substrate table from high acceleration and decelerations. Such vibrations make the job of alignment more difficult. Even though an alignment system and the grid plate may be coupled to the same frame within the lithographic apparatus, their relative position stability becomes insufficient to perform alignment of a substrate with respect to the substrate table at desired levels of accuracy.

SUMMARY OF THE INVENTION

Thus, what is needed is a system and method to efficiently control mechanical vibrations resulting from high speed movements of various components of the lithographic apparatus which substantially obviates drawbacks of conventional systems, described above or otherwise.

An exemplary embodiment of the invention provides a control system for controlling one or more support structures in a lithographic apparatus. The control system comprises a first measurement system, a second measurement system and a controller. The first measurement system is arranged to measure, in a first coordinate system, a position of an object supported by the support structure. The second measurement system is arranged to measure, in a second coordinate system, a position of the support structure. The first measurement system has a presumed position in the second coordinate system. The controller is configured to:

control the position of the support structure based on measurements by the second measurement system, convert the measured position of the object into a converted position of the support structure in the second coordinate system, and position the support structure based on the converted position.

The controller is further configured to receive a position error signal indicative of a difference between the presumed position and an actual position of the first measurement system in the second coordinate system. The controller is further arranged to control the position of the support structure and/or an aerial image in a manner dependent upon the position error signal.

An embodiment of the invention relates to a controller for positioning the support structure dependent upon the position error signal. An embodiment of the invention relates to a controller for positioning the support structure with respect to an aerial image. The support structure can be positioned with respect to a member of a group comprising an aerial image and a further object, such as a mask (MA). The aerial image comprises an image of the mask in an illumination phase (exposure phase) of a lithographic apparatus. Such an embodiment of the invention can also subsequently be useful for improving overlay error associated with a lithography process.

The further object could be another object in a system relative to which the first object should be positioned. The error correction according to an embodiment of the invention could be accomplished by correcting one of two of the objects for which the control system is controlling the position. In an embodiment the object in the first coordinate system is a substrate. The further object could be the patterning device. The patterning device will have an aerial image during illumination or exposure. The control system controls the relative position of the substrate with respect to the aerial image.

In another exemplary embodiment of the invention, the controller is arranged to position the support structure in a manner dependent upon the position error signal.

In an embodiment at least one of two measurement systems and in another embodiment the second measurement system comprises a reference structure to which the second coordinate system is coupled.

Additionally, in an exemplary embodiment, the aforementioned control system is a part of a lithographic projection apparatus.

Additionally, in an exemplary embodiment, a method for controlling a support structure in a lithographic apparatus is provided. Such a method comprises the exemplary steps of:

placing an object relative to a support structure arranged to support the object;

measuring the position of the object in a first coordinate system using a first measurement system;

measuring the position of the support structure in a second coordinate system, the first measurement system having a presumed position in the second coordinate system;

converting the measured position of the object into a converted position of the support structure in the second coordinate system;

performing a first positioning of the support structure and/or an aerial image in a manner dependent upon the measured position of the support structure, the converted position of the support structure, and a position error signal indicative of a difference between the presumed position and an actual position of the first measurement system in the second coordinate system.

Another exemplary embodiment of the invention provides a computer program product embodied in a machine-readable medium. The computer program product is encoded with instructions for performing, when executed by a processor, a method of controlling a support structure in a lithographic apparatus. The method comprises the steps of:

placing an object relative to a support structure arranged to support the object, measuring the position of the object in a first coordinate system with a first measurement system, measuring the position of the support structure in a second coordinate system, the first measurement system having a presumed position in the second coordinate system, converting the measured position of the object into a converted position of the support structure in the second coordinate system, and performing a first positioning of the support structure and/or an aerial image in a manner dependent upon the measured position of the support structure, the converted position of the support structure, and a position error signal indicative of a difference between the presumed position and an actual position of the first measurement system in the second coordinate system.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 2:
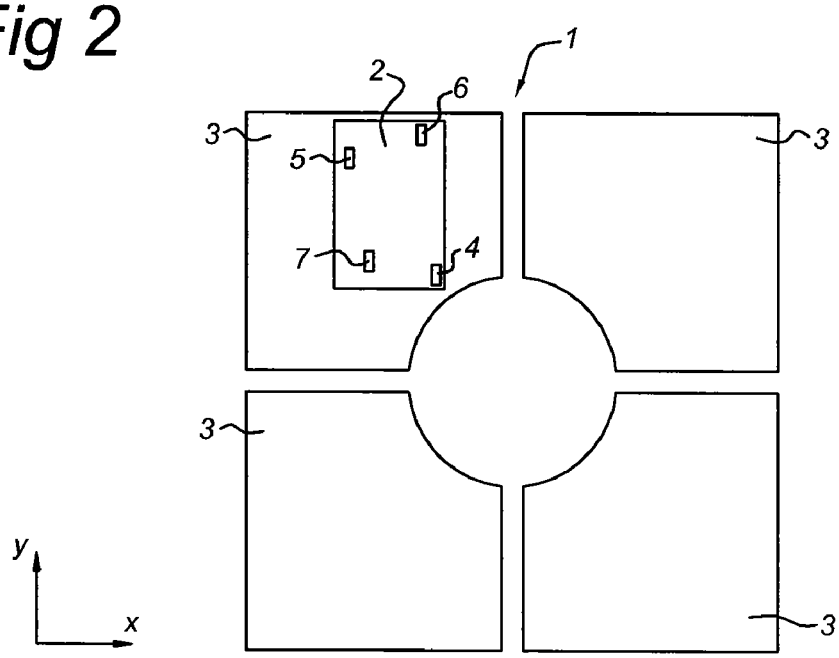
Figure 3:
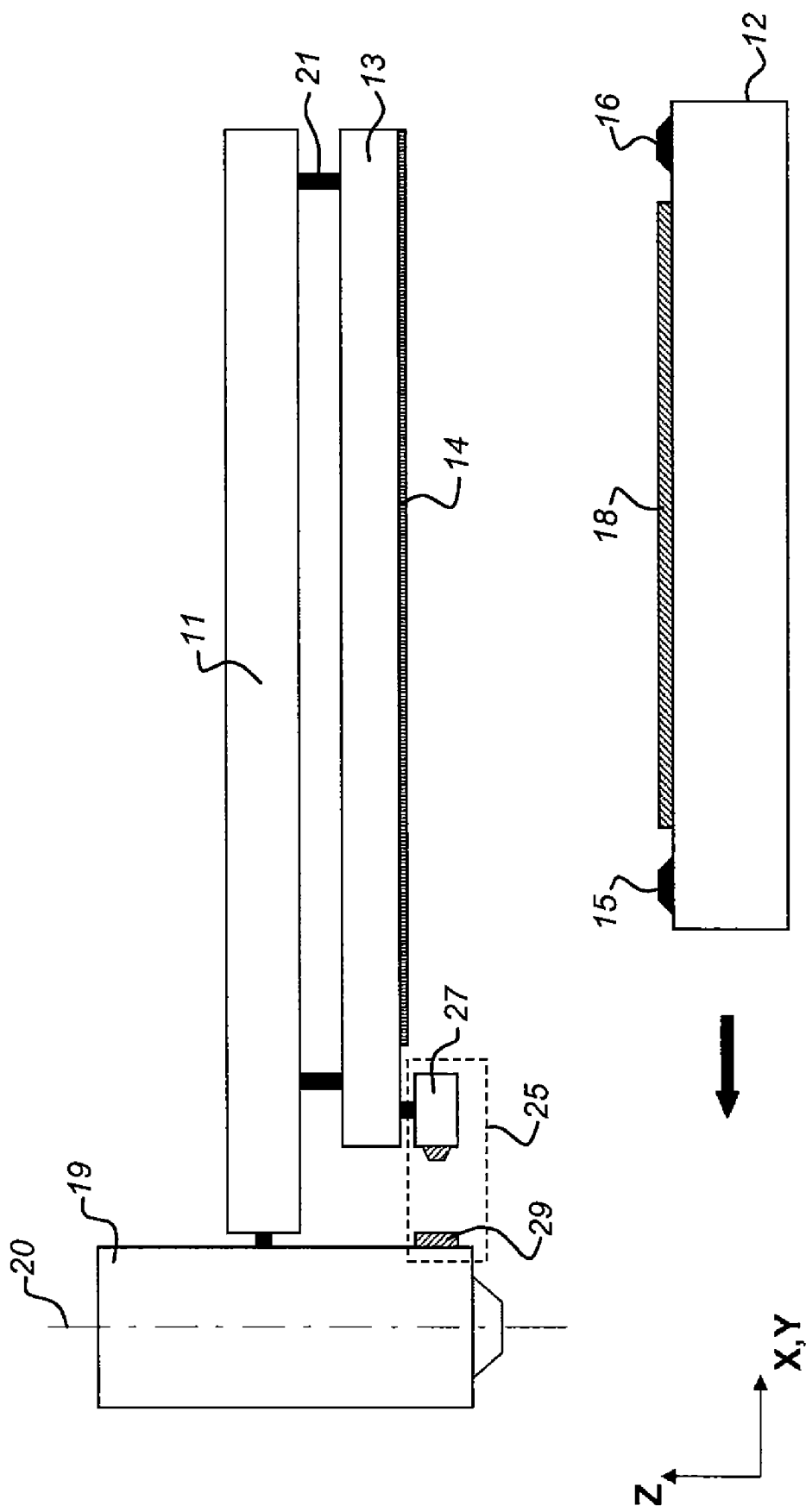
Figure 4:
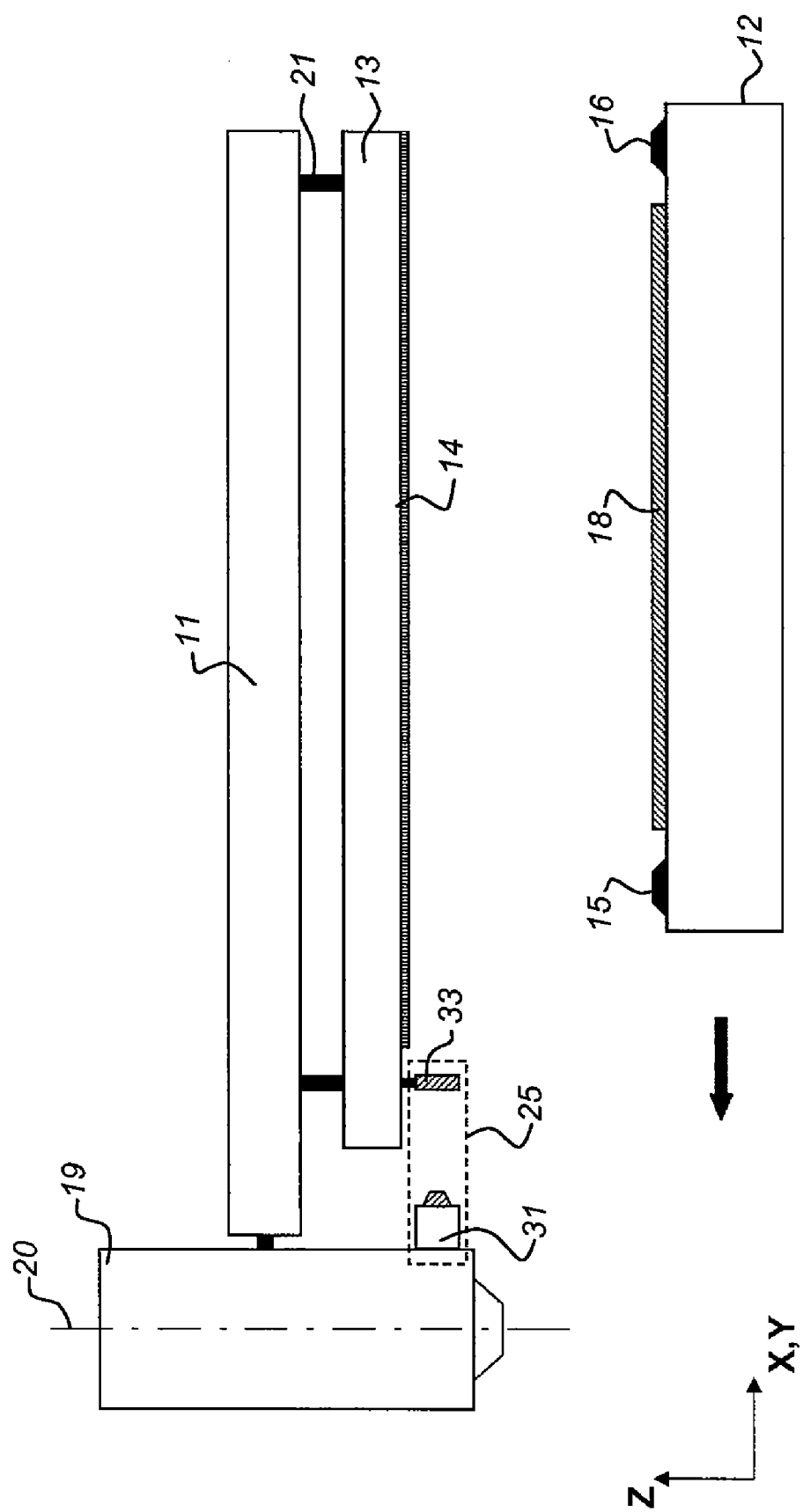
Figure 5:
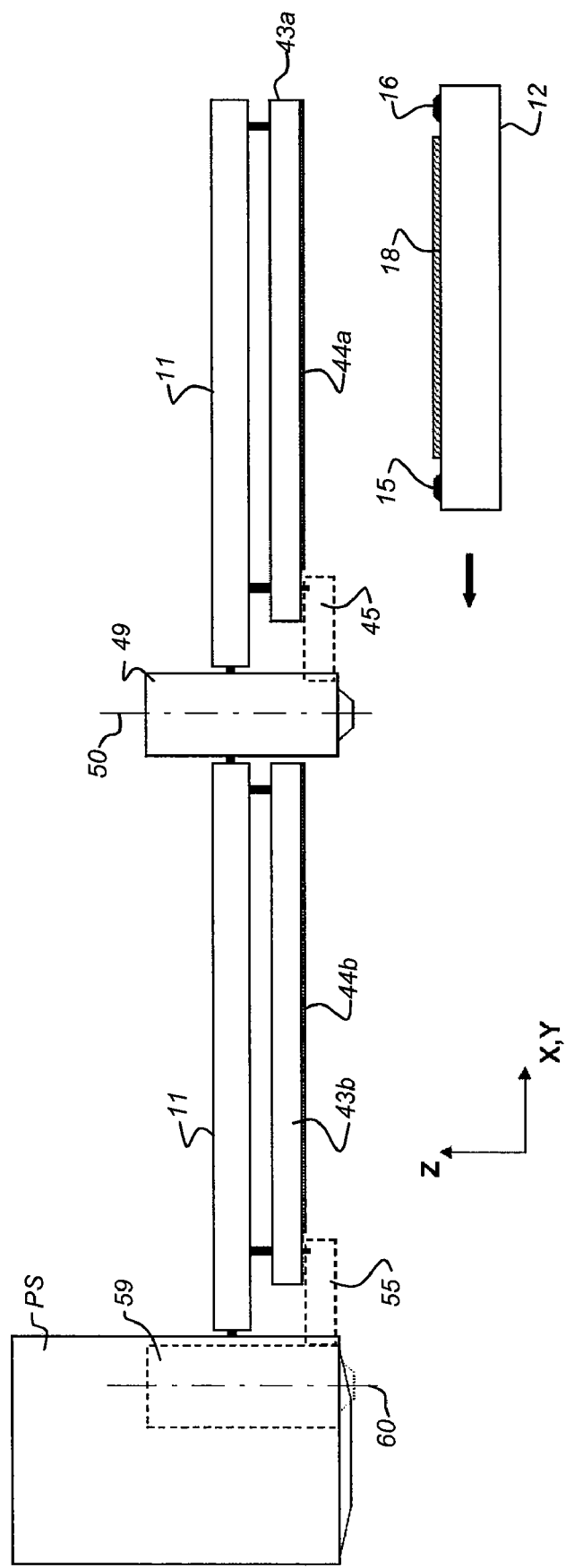
Figure 6:
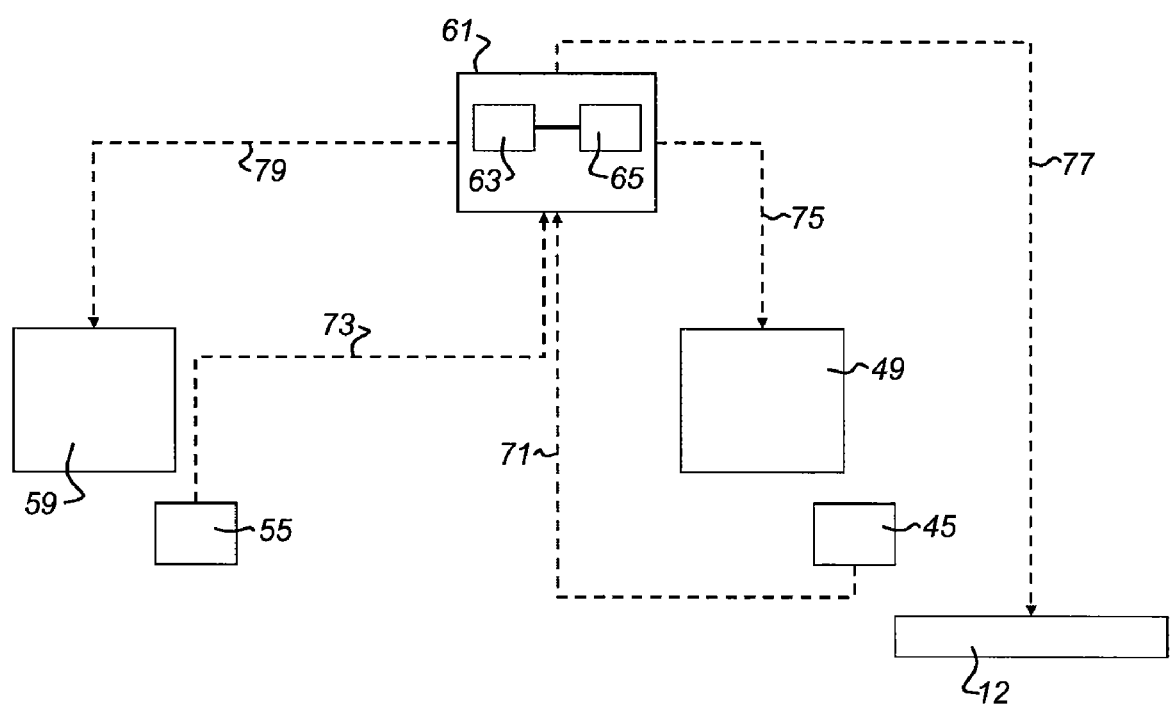
Figure 7:
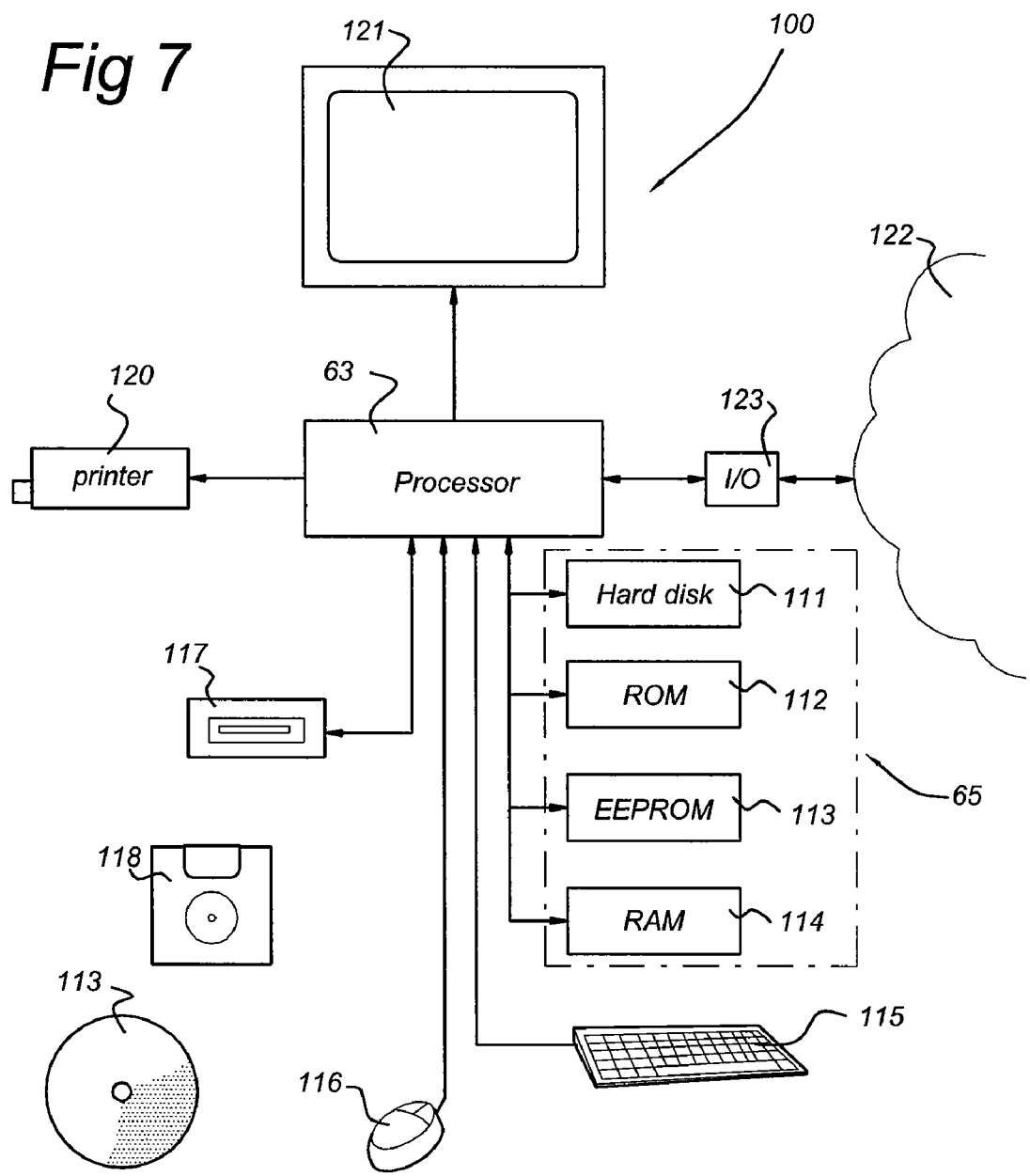

FIG. 1 depicts a lithographic apparatus according to an embodiment of the invention;

FIG. 2 schematically depicts a conventional displacement measuring system;

FIG. 3 schematically depicts a cross-sectional view of a part of a control system according to one embodiment of the invention;

FIG. 4 schematically depicts a cross-sectional view of a part of a control system according to another embodiment of the invention;

FIG. 5 schematically depicts a cross-sectional view of a part of a control system according to yet another embodiment of the invention;

FIG. 6 schematically depicts a flow diagram of a method of controlling a support structure according to an embodiment of the invention;

FIG. 7 schematically depicts an embodiment of a computer assembly that can be used by a control system according to an embodiment of the present invention.

Figure 8:
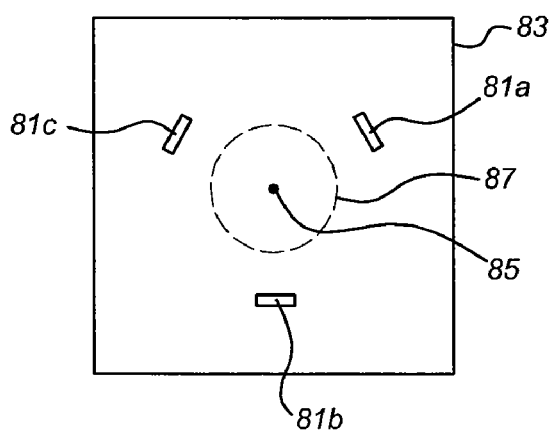

FIG. 8 illustrates a top view of a grid plate with leaf springs, according to another embodiment of the present invention.

The present invention will now be described with reference to the accompanying drawings. In the drawings, like reference numbers indicate identical or functionally similar elements.

DETAILED DESCRIPTION OF THE INVENTION

FIG. 1 schematically depicts a lithographic apparatus according to one embodiment of the invention. The lithographic apparatus comprises:

an illumination system (illuminator) IL configured to condition a radiation beam B (e.g. UV radiation or EUV radiation)

a support structure (e.g. a mask table) MT constructed to support a patterning device (e.g. a mask) MA and connected to a first positioner PM configured to accurately position the patterning device MA in accordance with one or more parameters.

a substrate table (e.g. a wafer table) WT constructed to hold a substrate (e.g. a resist-coated wafer) W and connected to a second positioner PW configured to accurately position the substrate W in accordance with additional one or more parameters, and a projection system (e.g. a refractive projection lens system) PS configured to project a pattern imparted to the radiation beam B by patterning device MA onto a target portion C (e.g. comprising one or more dies) of the substrate W.

Illumination system IL may include various types of optical components, such as refractive, reflective, magnetic, electromagnetic, electrostatic or other types of optical components, or any combination thereof, for directing, shaping, or controlling radiation.

Support structure MT supports, i.e. bears the weight of, patterning device MA. It holds patterning device MA in a manner that depends on the orientation of patterning device MA, the design of the lithographic apparatus, and other conditions, such as, for example, whether or not patterning device MA is held in a vacuum environment. Support structure MT can use mechanical, vacuum, electrostatic or other clamping techniques to hold patterning device MA. Support structure MT may be a frame or a table, for example, which may be fixed or movable as required. Support structure MT may ensure that the patterning device MA is at a desired position, for example, with respect to projection system PS. Any use of the terms "reticle" or "mask" herein may be considered synonymous with the more general term "patterning device.".

The term "patterning device" used herein should be broadly interpreted as referring to any device that can be used to impart a radiation beam with a pattern in its cross-section such as to create a pattern in a target portion of substrate W. It should be noted that the pattern imparted to radiation beam B may not exactly correspond to the desired pattern in a target portion C of substrate W, for example, when the pattern includes phase-shifting features or so called assist features. Generally, the pattern imparted to radiation beam B will correspond to a particular functional layer in a device being created in target portion C, such as an integrated circuit. The patterning device can be a programmable patterning device.

Patterning device MA may be transmissive or reflective. Examples of patterning device MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system.".

As depicted herein, the lithographic apparatus is of a transmissive type (e.g. employing a transmissive mask). Alternatively or additionally, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps before, during, and after exposure may be carried out on one or more tables while one or more other tables are being used for exposure.

The lithographic apparatus may also be of a type wherein at least a portion of substrate W may be covered by a liquid having a relatively high refractive index, e.g. water, so as to fill a space between projection system PS and substrate W. An immersion liquid may also be applied to other spaces in the lithographic apparatus, for example, between mask MA and projection system PS. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam B from a radiation source SO. Source SO and the lithographic apparatus may be separate entities, for example when the source SO is an excimer laser. In such cases, source SO is not considered to form a part of the lithographic apparatus and radiation beam B is passed from source SO to illuminator IL with the aid of a beam delivery system BD comprising, for example, suitable directing mirrors and/or a beam expander. In other cases, source SO may be an integral part of the lithographic apparatus, for example when source SO is a mercury lamp. Source SO and illuminator IL, together with beam delivery system BD if required, may be referred to as a radiation system.

Illuminator IL may comprise an adjuster AD for adjusting the angular intensity distribution of radiation beam B. Generally, at least the outer and/or inner radial extent (commonly referred to as □-outer and □-inner, respectively) of the intensity distribution in a pupil plane of illuminator IL can be adjusted. In addition, illuminator IL may comprise various other components, such as an integrator IN and a condenser CO. Illuminator IL may be used to condition radiation beam B, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses beam B onto one or more target portions C of substrate W. With the aid of second positioner PW and position sensor IF (e.g. an interferometric device, a linear encoder, or a capacitive sensor), substrate table WT can be moved accurately, so as to position different target portions C in the path of radiation beam B. Similarly, first positioner PM and another position sensor (which is not explicitly depicted in FIG. 1) can be used to accurately position mask MA with respect to path of radiation beam B, e.g., after mechanical retrieval from a mask library, or during a scan. In general, movement of mask table MT may be realized with the aid of a long-stroke module (coarse positioning) and a short-stroke module (fine positioning), which form a part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although substrate alignment marks P1, P2 as illustrated occupy dedicated target portions, they may be located in spaces between target portions (these are known as scribe-lane alignment marks). Further, even though only two mask alignment marks M1, M2, and two alignment marks P1, P2, are shown, any number of alignment marks may be used, depending on specific needs and applications. In situations where more than one die is provided on the mask MA, the mask alignment marks M1, M2 may be located between the dies.

An exemplary embodiment of the invention relates to positioning one or more of various moveable elements of the lithographic apparatus. For example, support tables MT and WT are positioned using a controller. Positioning includes, for example, positioning support tables MT and WT with respect a frame of the apparatus or with respect to (or, relative to) a moving or a stationary element, or a non-material element of the lithographic apparatus. The non material element could be an aerial image. The aerial image is the image of the patterning device onto the substrate during illumination.

The depicted apparatus could be used in at least one of the following modes:

1. In a step mode, mask table MT and substrate table WT are kept essentially stationary, while an entire pattern imparted to radiation beam B is projected onto one or more target portions C at one time (i.e. a single static exposure). Substrate table WT is then shifted in the X and/or Y direction so that a different target portion C can be exposed. In the step mode, the maximum size of the exposure field limits the size of target portion C imaged in a single static exposure.

2. In a scan mode, mask table MT and substrate table WT are scanned synchronously while a pattern imparted to radiation beam B is projected onto a target portion C (i.e. a single dynamic exposure). The velocity and direction of substrate table WT relative to mask table MT may be determined by the (de-)magnification and image reversal characteristics of projection system PS. In the scan mode, the maximum size of the exposure field limits the width (in the non-scanning direction) of target portion C in a single dynamic exposure, whereas the length of the scanning motion determines the height (in a scanning direction) of target portion C.

3. In another mode, mask table MT is kept essentially stationary holding a programmable patterning device, and substratetable WT is moved or scanned while a pattern imparted to radiation beam B is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of type described above.

Combinations and/or variations on the above described modes of use or entirely different modes of use may also be employed. Various embodiments of the present invention can be incorporated in a measurement system in such a way that alignment of a substrate can be performed with respect to a substrate table with a higher accuracy than might otherwise be possible using state-of-the-art systems.

FIG. 2 schematically depicts a displacement measuring system 1 designed to accurately measure a position of a substrate table 2 in three coplanar degrees of freedom, e.g., a position in a first direction, (x-position), a position in a second direction, (y-position), and a position related to rotation about an axis perpendicular to both first and second directions, rotation about a z-axis Rz, the z-axis being the axis perpendicular to the x and y axes shown in FIG. 2.

In the shown embodiment, the displacement measuring system 1 comprises four adjacent grid plates 3 which are mounted on the lithographic apparatus. Each grid plate 3 is provided with a grid with a resolution that is high enough to obtain the accuracy needed. In the shown embodiment, four grid plates 3 are used as the physical dimensions of grid plates 3 are limited. However, it must be understood that also other arrangements comprising a different number or shape of grid plates can be used. For example, a single grid plate of the size of the working area may be used.

Grid plates 3 may be mounted on a separate frame, i.e., a so-called metrology frame, or on a lens which is part of projection system PS. Grid plates 3 are substantially flat plates arranged in a plane which extends in the first and second directions, i.e. in the x-direction and y-direction. Grid plates 3 are positioned in such a way that at least one side of each grid plate 3 is adjacent to a side of another grid plate 3. Together, grid plates 3 substantially cover all required locations of the substrate table 2, such that the measuring system 1 is continuously capable of measuring position of substrate table 2.

In the shown embodiment, substrate table 2 is arranged underneath the grid plates 3. On the substrate table 2, two x-sensors 4, 5, and two y-sensors 6, 7 are arranged. Sensors 4, 5, 6, 7 are arranged to measure the position of substrate table 2 with respect to the grids on respective grid plates 3. X-sensors 4, 5 are arranged for measuring the position of substrate table 2 in the x-direction. Y-sensors 6, 7 are arranged for measuring the position of substrate table 2 in the y-direction. Information obtained from one pair of the two x-sensors 4, 5 and two y-sensors 6, 7 (x, x; x, y; y, x or y, y) may be used to determine the rotation about the z-axis, i.e., rotation in the x-y plane. With three of the two x-sensors 4, 5 and two y-sensors 6, 7 it is possible to continuously determine the position of the substrate table 2 in three coplanar degrees of freedom (x, y, Rz) with high accuracy (nanometer or sub-nanometer resolution). Generally, it is advantageous to be able to determine the position of substrate table 2 at all possible locations within a lithographic apparatus, where substrate table 2 may appear during normal use of this lithographic apparatus. Such possible locations may include, for example, an exposure area, a transfer area for movement towards and away from the exposure area, an alignment and leveling area and a substrate exchanging area.

Each of the x-sensors and y-sensors may be designed as described in Kwan above, incorporated herein in its entirety by reference.

Combination of an arrangement of the four sensors 4, 5, 6, 7 and the adjacent arrangement of the four grid plates 3 enables a sensor take-over from one grid plate 3 to another grid plate 3. During a sensor take-over, i.e., when a first sensor first cooperating with first grid plate 3 moves towards a position in which it will cooperate with second grid plate 3, a second sensor may provide a signal to ensure a continuous measurement. Then, when the first sensor is in the range of second grid plate 3, e.g., after re-initialization, the first sensor may again provide a signal representative for the position of substrate table 2.

As described above three of the two x-sensors 4, 5 and y-sensors 6, 7 make it possible to determine the position of the substrate table 2 in three coplanar degrees of freedom. There is thus, one redundant sensor. The redundant sensor may be used in case one of the other sensors cannot be used, e.g. because it is outside the range of the grid plates 3 or a damaged area in the grid plate 3 causes the sensor on that location to be incapable of performing measurements.

By selectively using a set of three sensors which can each properly determine a signal representative for a position in the x-direction or y-direction, continuous control may be obtained. The selection of the respective x-sensors and y-sensors may be performed by a selection device (not shown explicitly in FIG. 2). The selection/choice of the respective grid plate 3 depends on the position of substrate table 2. When all four sensors 4, 5, 6, 7 can deliver a signal, the signal generated by the redundant sensor can be used for calibration purposes.

FIG. 3 schematically depicts a cross-sectional view of a part of a control system according to a first embodiment of the invention. In the first embodiment of the invention, the control system comprises a frame 11 supporting a first measurement system. The first measurement system comprises an alignment module or an alignment system 19 arranged for measuring a position of substrate 18 in a first coordinate system. A possible measurement result of alignment system 19 is that substrate 18 is in a position (a1,b1,c1) wherein the subscripts indicate that the coordinates are in the first coordinate system. When a mark is detected at the location of the neutral axis, the alignment system 19 indicates 0,0 as aligned position of the mark.

The control system is arranged to control a substrate table 12 which is arranged to support substrate 18. The control system controls the position of substrate table 12 using a second measurement system (comprising elements 13,14,15, 16). Second measurement system (13,14,15,16) measures the position of substrate table 12 in a second coordinate system. Second measurement system (13,14,15,16) includes a grid plate 13 supported by frame 11. Substrate table 12 is movably positioned underneath grid plate 13. The position of substrate table 12 is controlled by measuring the position of substrate table 12 relative to grid plate 13 in a second coordinate system as a function of time. Alignment system 19 has a presumed position (e.g., denoted by k2,l2,m2) in the second coordinate system. The presumed position is determined by either calibration, design or by a reference measurement and is stored in, or is otherwise made available to, the control system.

Grid plate 13 is an embodiment of the reference structure to which the second coordinate system is coupled. Such a grid plate 13 is a large object in a lithographic apparatus and as such has a substantial weight. Grid plate 13, although connected to the main frame of the lithographic apparatus can have an unstable position, at least for the nanometer domain of exposure. It is advantageous to overcome this effect of instability and to improve the positioning of substrate 18 and/or substrate table 12 relative to another object, such as the frame or a patterning device or an aerial image of the patterning device.

Since substrate table 12 is under the control of the second measurement system (13,14,15,16), the position of substrate table 12 when measuring the position of substrate 18 is known and in this case is, for example denoted by (x2,y2,z2), wherein the subscripts indicate that the coordinates are in the second coordinate system.

The control system comprises a controller (not shown) which converts the position (a1,b1,c1) of substrate 18 as measured by alignment system 19 with respect to the first coordinate system to a position of substrate table 12 in the second coordinate system. The position of substrate 18 in the second coordinate system is determined depending on the presumed position (k2,l2,m2) of alignment system 19 in the second coordinate system and the measured position (a1,b1, c1) of substrate 18 in the first coordinate system. The controller couples this to the position (x2,y2,z2) of substrate table 12 when the position of substrate 18 was measured. After this conversion, substrate 18 can be positioned by positioning substrate table 12.

The position of substrate table 12 is measured relative to grid plate 13. At the surface side of grid plate 13 facing substrate table 12, grids 14 are provided. On substrate table 12, sensors 15, 16 are arranged. Sensors 15, 16 may be x-sensors or y-sensors similar to x-sensors 4, 5 or y-sensors 6, 7 discussed with reference to FIG. 2. Thus, x-sensors are arranged for measuring the position of substrate table 12 in the x-direction, while y-sensors are arranged for measuring the position of the substrate table 12 in the y-direction. Sensors 15, 16 are arranged for measuring the position of substrate table 12 with respect to the grids 14 on grid plate 13.

In an embodiment, the second measurement system (13, 14, 15, 16) is an incremental position measurement system. An incremental position measurement system does not provide an absolute position measurement but provides information about a distance traveled between a first position and a second position by counting the number of increments that are detected during a displacement from the first position to the second position. In this embodiment, grids 14 on grid plate 13 comprise a periodic structure, e.g., a grating with a period p. A final position of substrate 18 is determined by looking at the position within an increment, i.e., how far substrate table 12 has moved with respect to the last passage of a whole increment, resulting in a value between 0 and 1, also referred to as 'phase'. More details with respect to such an incremental position measurement system can be found in U.S. Patent Application Publication No. 2007/0052976 titled "Position Measurement System and Lithographic Apparatus" of Pril et al., incorporated herein in its entirety by reference.

An incremental position system as described above may be used in combination with a reference system for zeroing techniques. Such a reference system may also be connected to reference frame 11. The reference system provides a reference or zero position to provide a basis from which the incremental position measurements can be performed. Additionally or alternatively, such a combination can also enable an absolute position determination. Since the position of substrate table 12 is measured by counting increments made by the incremental position system, in an embodiment, second measurement system (13, 14, 15, 16) enables calculation of the absolute position when the starting position from which the increments are counted is determined. An embodiment of a reference system as described above is described in more detail in U.S. patent Application Publication No. 2004/0211921 titled "Position measuring device, position measuring system, lithographic apparatus, and device manufacturing method" to Castenmiller et al., incorporated herein in its entirety by reference.

The control system further comprises a position error sensor 25 functioning as a displacement measurement module. Position error sensor 25 is arranged for determining a relative position between alignment system 19 and grid plate 13 as a function of time. Position error sensor 25 comprises, for example, two parts, a first sensor part 27 and a second sensor part 29, as shown in FIG. 3. In an exemplary embodiment, first and second sensor parts 27, 29 represent a detection signal generating and receiving unit and a reflective element, respectively. The detection signal generating and receiving unit is arranged to generate and transmit a detection signal in the direction of the reflective element. The time it takes for the detection signal to travel from the detection signal generating and receiving unit toward the reflective element and back constitutes a measure of the relative position between them.

The detection signal generating and receiving unit is coupled to gridplate 13 and accordingly moves with the gridplate 13. The reflective element is coupled to alignment system 19 and accordingly moves with the alignment system 19. Therefore, the relative position between alignment system 19 and grid plate 13 can be measured with the position error sensor 25.

Alternatively, first sensor part 27 and second sensor part 29 of position error sensor 25 may represent a detection signal source and detection signal detector, respectively. The detection signal source, for example, can be connected to grid plate 13 and arranged to provide a detection signal in the direction of the detection signal detector. The detection signal detector can be connected to alignment system 19 and arranged to detect at least a portion of the detection signal generated by the detection signal source. If the position of the detection signal source with respect to grid plate 13 and the position of the detection signal detector with respect to alignment system 19 are known, the time it takes for the detection signal to travel from the detection signal source towards the detection signal detector is a measure of the relative position between alignment system 19 and grid plate 13.

As will be understood by a skilled person, in embodiments of the invention various types of sensors may be used that are different from the embodiments of sensor 25 described above. For example, position error sensor 25 may be a capacitive sensor comprising two parts 27 and 29, or an encoder type sensor comprising two parts 27 and 29.

Sensor 25 may be arranged for communication with a controller (not shown). Such a controller may comprise a processor arranged to calculate the relative position between alignment system 19 and grid plate 13 as a function of time.

As will be understood by a skilled person, even though the control system is described by referring to grid plate 13 having grids 14 in an x-direction and y-direction, i.e., a two-dimensional grid, it is also possible to provide the control system with a structure comprising grids 14 in a single direction, or in more than two dimensions.

FIG. 4 schematically depicts a cross-sectional view of a part of a control system according to a second embodiment of the invention. In this embodiment of the control system, a first sensor part 31 (shown in FIG. 3 as sensor part 27) of position error sensor 25 is connected to alignment system 19 and a second sensor part 33 (shown in FIG. 3 as sensor part 29) of position error sensor 25 is connected to grid plate 13. Position error sensor 25 in this embodiment operates in a similar way as embodiments of the position error sensor 25 of FIG. 3.

FIG. 5 schematically depicts a cross-sectional view of a part of a control system according to a further embodiment of the invention. The control system comprises two subsystems—a first subsystem and a second subsystem. The first subsystem, e.g., the subsystem of the second embodiment, schematically depicted in FIG. 4, comprises a grid plate 43a and a first alignment system 49. First alignment system 49 has a neutral axis, represented in FIG. 5 by a dashed line denoted as reference numeral 50. Both first alignment system 49 and grid plate 43a are connected with a frame 11. The first subsystem is arranged to determine a position of substrate 18 located on substrate table 12, which is arranged for moving underneath grid plate 43a. At the surface side of grid plate 43a facing the substrate table 12, grids 44a are provided. Similarly, as described hereinbefore, substrate table 12 may be provided with sensors 15, 16 arranged for measuring the position of substrate table 12 with respect to grids 44a on grid plate 43a.

The first subsystem further comprises a first position error sensor 45, similar to position error sensor 25 schematically depicted in FIG. 4. First position error sensor 45 is arranged to determine a relative position between first alignment system 49 and grid plate 43a as a function of time. First position error sensor 45 may comprise two parts, similar to first sensor part 27, 31 and second sensor part 29, 33 as described hereinbefore with respect to FIGS. 3 and 4, respectively.

The second subsystem, also referred to as a further subsystem, comprises a grid plate 43b and a second alignment system 59, arranged in conjunction with projection system PS. Second alignment system 59 has a neutral axis, in FIG. 5 represented by the dashed line denoted as reference numeral 60. Both second alignment system 59 and grid plate 43b are connected with frame 11. The second subsystem is also arranged to determine a position of substrate 18 located on substrate table 12, however, in this case with respect to movement underneath grid plate 43b. Grid plate 43b may, just like grid plate 43a, be provided with grids 44b such that the position of substrate table 12 with respect to the grids 44b on grid plate 43b may be determined by means of sensors 15, 16 provided on substrate table 12.

The second subsystem further comprises a second position error sensor 55. Second position error sensor 55 is arranged to determine a relative position between second alignment system 59 and grid plate 43b. Additionally or alternatively, in this embodiment, second position error sensor 55 can determine a relative position between projection system PS and grid plate 43b, as a function of time. Second position error sensor 55 can also comprise two parts, similar to first sensor part 27, 31 and second sensor part 29, 33 as described earlier with respect to the first and second embodiments and depicted in FIGS. 3 and 4 respectively.

In an embodiment of the control system, first position error sensor 45 is a sensor similar to the position error sensor 25 depicted in FIG. 3, i.e. its first sensor part is connected to the grid structure, e.g. grid plate 43b. In this embodiment, second position error sensor 55, on the other hand, is a sensor similar to position error sensor 25 depicted in FIG. 4, i.e. the first sensor part of the sensor is connected to the projection system PS.

First position error sensor 45 may be arranged for communication with second position error sensor 55, e.g., via a controller (not shown). Further details with respect to the form and content of such aforementioned communication will be explained with reference to FIG. 6 below.

As will be understood by a skilled person, even though the first and second subsystems are described by referring to grid plates 43a, 43b having grids 44a, 44b respectively, it is also possible that both subsystems comprise structures provided with a single grid in a single direction. In that case, the control system can be arranged to monitor a position in one dimension. Alternatively or additionally, various embodiments of this invention can be extended to perform operations in three dimensions.

It must be understood that the reference to the X,Y-direction in FIGS. 3-5 is meant to portray that in embodiments of the invention, substrate table 12 may be moved in a first direction, e.g., the X-direction, in order to obtain an alignment position of substrate 18 provided on substrate table 12 with one of alignment systems 19, 49, 59 in the X-direction, while the X-position of substrate table 12 is monitored with respect to one of grid plates 13, 43a, 43b by means of sensors 15, 16, being first encoder type sensors, i.e., x-sensors, in this case. Similarly, substrate table 12 may be moved in a second direction, e.g., a Y-direction, in order to obtain an alignment position of substrate 18 provided on substrate table 12 with one of alignment systems 19, 49, 59 in a Y-direction, while the Y-position of substrate table 12 is monitored with respect to one of the grid plates 13, 43a, 43b by means of sensors 15, 16, being second encoder-type sensors, i.e., y-sensors, in this case. The X-direction may be orthogonal to the Y-direction.

Similarly, position error sensors 25, 45, 55 may comprise two sensor elements, i.e., a sensor element arranged for measuring a relative position between respective alignment systems 19, 49, 59 and respective grid plates 13, 43*a*, 43*b* as a function of time in a first direction, e.g., the X-direction, and a sensor element arranged for measuring a relative position between respective alignment systems 19, 49, 59 and respective grid plates 13, 43*a*, 43*b* as a function of time in a second direction, e.g., the Y-direction. Each sensor element can comprise a first sensor part and a second sensor part as described hereinbefore.

As mentioned hereinbefore, in various embodiments of the invention, only measurements in a single direction, e.g., only the X-direction or only the Y-direction, are measured. In such a case, sensors 25, 45, 55 may be arranged for a measurement in a single direction only. Additional arrangements of sensors can be used to provide a higher accuracy in measurement of position data, as and when needed.

With the continual desire to image ever smaller patterns to create devices with higher component densities, while keeping the number of patterns manufactured per unit time the same, or even increase that number, numerous tasks within a lithographic apparatus need to be performed faster. Consequently, accelerations and decelerations of substrate table 12 increase as well, which may lead to grid plate vibrations. Typically, such vibrations of the grid plate(s) 13, 43*a*, 43*b* is between 100-300 Hz, in particular between 160-180 Hz for horizontal vibrations, i.e., vibrations in plane with the surface of the structure provided with at least one of grids 14,44*a*,44*b*, comprising grid plates 13, 43*a*, 43*b*, and between 250-300 Hz for vertical vibrations, i.e., vibrations perpendicular to the surface of the structure provided with at least one of grids 13, 43*a*, 43*b*, e.g., grid plate 13, 43*a*, 43*b*.

In alternative embodiments, position error sensor 25 measures the position of grid plate 13 and thereby of grid 14 relative to the frame 11, as shown in FIG. 4. The position of first alignment system 19 relative to frame 11 is presumed fixed. In this embodiment, position error sensor 25 measures the only varying component in the relative distance between the first measurement system (including, for example, alignment system 19) and the second measurement system (including, for example, grid plate 13 and grid 14). Alternatively, the position of the first measurement system (including alignment system 19) relative to frame 11 can be measured by position error sensor 25 and the position of grid plate 13 and thereby of grid 14 relative to frame 11 is presumed fixed.

FIG. 6 schematically depicts a flow diagram of a method for improving position control using a control system of the further embodiment as schematically depicted in FIG. 5. One or more elements of the control system are enabled to communicate with a controller 61. Controller 61 comprises a processor 63 and a memory 65. More details with respect to various embodiments of processor 63 and memory 65 will be discussed with reference to FIG. 7 using labels from previous figures.

Controller 61 is arranged to modify certain control parameters based on one or more measurements performed by a position error sensor, e.g., a first position error sensor 45 and second position error sensor 55.

In case first position error sensor 45 is used, measurement data related to the relative position as a function of time between first alignment system 49 and grid plate 43*a* is transferred to controller 61 as shown by arrow 71. Similarly, when second position error sensor 55 is used, measurement data related to the relative position as a function of time between second alignment system 59 and grid plate 43*b* is transferred to controller 61 as shown by arrow 73. Controller 61 can use the measurement data from the one or more position error sensors 45, 55, in different ways which will be described hereafter. The different ways in which the controller 61 can use the position error signal may be combined in various ways that are readily apparent upon a review of the instant disclosure.

In an embodiment, controller 61 uses measurements made by the position error sensor 25 to dampen relative movements between the first measurement system (which, for example, includes alignment system 19,49) and the second measurement system (which, for example, includes grid plates 13,43*a*,43*b*). As described earlier, the first measurement system (which, for example, includes alignment system 19,49) has a presumed position in the second coordinate system which is coupled to the second measurement system (which, for example, includes grid plates 13,43*a*,43*b*). In this embodiment, the position error signal from position error sensor 25 is fed to an actuator (not shown) to drive either the first measurement system (including, for example, alignment system 19,49) and/or the second measurement system (including, for example, grid plates 13,43*a*,43*b*) to the presumed relative positions. This method can be applied when the relative positions of the first measurement system and the second measurement system are measured directly, and also when one of the first measurement system and the second measurement system is presumed fixed and the position of the other measurement system relative to the frame is measured. Thus, the actuator dampens the relative movements of the first measurement system and the second measurement system.

In an embodiment, the control system is arranged to receive target relative positions of the first measurement system (which, for example, includes alignment system 19,49) and substrate table 12 in the second coordinate system. Such an arrangement can be used, for example, to measure the position of substrate 18 while the first measurement system and the substrate table 12 are in their target relative position. Thereby, using such an arrangement the presumed position of the first measurement system in the second coordinate system is accounted for. Since the target relative positions are in the second coordinate system and the actual position of the first measurement system (which, for example, includes the alignment system 19,49) varies around its presumed position, the actual measurement by the first measurement system can include an error. In this embodiment, controller 61 uses a signal from position error sensor 25 to control the position of the support structure depending on the position error signal and depending on the target relative positions when measuring the position of substrate 18 with the first measurement system. More specifically, controller 61 adjusts the position of support structure 12 to compensate for the deviation between the actual and the presumed position of the first measurement system in the second coordinate system. Alternatively, the position of the first measurement system is controlled to compensate, for instance, using a dampening system, for the deviation between the actual and the presumed position of the first measurement system. It is to be noted that to control the relative positions of the coordinate systems coupled to the respective measurement systems, it is not important which measurement system is vibrating.

Although the figures illustrate various embodiments of the invention with regard to substrate table 12, it is to be noted that substrate table 12 is an exemplary embodiment of a support structure to be used in combination with other embodiments of the invention. In an embodiment, the support structure having a presumed position in the second coordinate system is a part of the reticle stage for supporting patterning device MA. In another embodiment, the second measurement system is arranged to measure the position of support structure MT holding patterning device MA. Such an arrangement is used to measure the position of patterning device MA, while the first measurement system and support structure MT are in the target relative position. Thereby, the presumed position of the first measurement system in the second coordinate system is account for. Since the target relative positions are in the second coordinate system and the actual position of the first measurement system (which, for example, includes a patterning device alignment system) varies around its presumed position, the actual measurement made by the first measurement system can comprise an error. Also in this embodiment, a position error sensor can be used to measure an error signal. Controller 61 can use a signal from the position error sensor to control the position of the support structure MT in dependence on the position error signal and the target relative positions when measuring the position of the patterning device with the first measurement system. More specifically, controller 61 adjusts the position of support structure MT to compensate for the deviation between the actual and the presumed position of the first measurement system in the second coordinate system. Alternatively or additionally, the position of the first measurement system is controlled to compensate, for instance, using a dampening system, for the deviation between the actual and the presumed position of the first measurement system. It is not important which measurement system is vibrating or if both measurement systems are vibrating; the relative positions of the coordinate systems coupled to the respective measurement systems are controlled.

In yet a further embodiment controller 61 is arranged to correct the position of support structure MT of the patterning device MA according to or dependent on a received error signal for correction of the presumed position of the first measurement system for measuring the position of substrate W on substrate table 18, while the position of substrate table 18 is measured using the second measurement system. Such a correction is advantageous, for example, during a combined illumination of patterning device MA and substrate 18. The patterning device will provide an aerial image of the pattern onto the substrate. Even though an error signal is measured for substrate table 18, such a measurement can be used for adapting the position of the aerial image. The position of the aerial image is adapted by positioning support structure MT for patterning device MA in accordance with the error signal. Without such a correction in the position of the aerial image, the aerial image might be positioned dependent on the presumed position of the substrate carried by substrate table WT leading to exposure errors. However, the position of the aerial image relative to the substrate can be corrected by positioning the support structure MT of the patterning device dependent on the received error signal from position error sensor 25.

In yet another embodiment controller 61 is arranged to correct the position of substrate table 18 according to a received error signal for correction of the presumed position of the first measurement system for measuring the position of patterning device MA held in support structure MT, while the position of support structure MT is measured using a the second measurement system.

In yet a further embodiment two error signals are received from two first independent measurement systems, such as measurement systems for positioning substrate table 18 and support structure MT. The controller is capable of calculating a combined error from the received signal and can use the calculated error combination signal to correct the positioning of one of the two support structures 18 and MT.

In an embodiment, controller 61 is arranged to convert the position of substrate 18 in the first coordinate system to a converted position of substrate table 12 in the second coordinate system using:

the position of the substrate measured by the first measurement system (which, for example, includes alignment system 19,49)

the presumed position of the first measurement system in the second coordinate system the position of the support structure (e.g, substrate table 12) in the second coordinate system and is also arranged to correct the converted position in dependence on the position error signal. This is explained hereinbefore in relation to the exemplary embodiment shown in FIG. 3.

Alternatively, the converted position is not corrected afterwards as in the first embodiment described in FIG. 3. Instead, the actual position of the first measurement system (which, for example, includes alignment system 19,49) in the second coordinate system (which is coupled to the second measurement system that can include, for example, grid plate 13,43*a*) is used to convert the position of substrate 18 to a converted position of the substrate table 12 in the second coordinate system. The actual position of the first measurement system in the second coordinate system is obtained by correcting the presumed position with the position error signal from position error sensor 25.

The different ways in which the controller 61 may use the position error signal, in practice, may be followed by positioning the substrate table 12 for illuminating the substrate 18 with an image formed by a patterned beam of radiation B. By using the converted position, substrate 18 is positioned with respect to the pattern in beam B so that a good overlay can be obtained. Alternatively or additionally, the first measurement system comprises a level sensor for measuring the position of a surface of substrate 18 facing away from substrate table 12 and the control system is capable of bringing the surface precisely into focus, i.e., at a position in patterned beam B where a sharp image is formed.

In the previous embodiments, sampling moments of different sensors, e.g., sensors 45, 55, and alignment systems 49, 59 may need to be dynamically adapted, i.e., synchronized or calculated.

It should be understood that processor 63 of controller 61 as used throughout this text can be implemented in a computer assembly 100 as shown in FIG. 7. Computer assembly 100 may be a dedicated computer in the form of controller 61 in embodiments of the assembly according to the invention or, alternatively, be a central computer controlling the lithographic projection apparatus. A memory 65 connected to processor 63 may comprise a number of memory components, such as a hard disk 111, a Read Only Memory (ROM) 112, an Electrically Erasable Programmable Read Only Memory (EEPROM) 113 and a Random Access Memory (RAM) 114. Not all aforementioned memory components need to be present. Furthermore, it is not essential that the aforementioned memory components are physically located in close proximity to the processor 63 or to each other. They may be distributed and/or located at a distance away Processor 63 may also be connected to some kind of user interface, for instance, a keyboard 115 or a mouse 116. A touch screen, track ball, speech converter or other interfaces that are known to persons skilled in the art may also be used.

Processor 63 may be connected to a reading unit 117, which is arranged to read data from and, under some circumstances, store data on a data carrier, like a floppy disc 118 or a CDROM 119. In addition, Digital Versatile Disks (DVDs) or other data carriers known to persons skilled in the art may be used.

Processor 63 may also be connected to a printer 120 to print out output data on paper as well as to a display 121, for instance a monitor or LCD (Liquid Crystal Display), or any other type of display known to a person skilled in the art.

Processor 63 may be connected to a communications network 122, for instance a public switched telephone network (PSTN), a local area network (LAN), a wide area network (WAN) etc. by means of transmitters/receivers 123 responsible for input/output (I/O). Processor 63 may be arranged to communicate with other communication systems via the communications network 122. In an embodiment of the invention, external computers (not shown), for instance personal computers of operators, can log into processor 63 via a communications network 122.

Processor 63 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 63 may even be located a distance away from the other processing units and communicate via a communications network 122.

Computer assembly 100 may be arranged for loading a computer readable medium comprising computer executable code, also referred to as a computer program product. This may enable computer assembly 100 to execute, when the computer executable code on the computer readable medium is loaded, embodiments of aforementioned method of controlling a support structure like a substrate table 12 in a lithographic apparatus.

In embodiments of the invention, the measurement precision of position error sensor 25, first position error sensor 45 or second position error sensor 55 is enhanced by reducing dependence on temperature. This, for instance, can be done by mounting first sensor part 27 of position error sensor 25 on a member with a low thermal expansion coefficient, for instance with a value below $0.1 \times 10^{-6}$ K$^{-1}$ or below $2 \times 10^{-8}$ K$^{-1}$. The member is for instance made of Zerodur™ glass ceramic (manufactured by Schott Glas, Hattenbergstraβe 10 55120, Mainz, Germany). The function of the member is to reduce the distance between first sensor part 27 and second sensor part 29 and to provide a position for first sensor part 27 that does not depend on temperature.

In an embodiment, first sensor part 27 comprises a laser and a detector and second sensor part 29 comprises a mirror, and the detection signal travels through a gas between first sensor part 27 and second sensor part 29. Together first sensor part 27 and second sensor part 29 are operated as an interferometer measuring a parameter that depends on the time for the detection signal to travel from first sensor part 27 to second sensor part 29 and back as explained hereinbefore. This time depends on the optical index of refraction, which in turn depends on the temperature of the gas. The larger the distance between first sensor part 27 and second sensor part 29, the larger the absolute influence of temperature on the time. Reducing the distance, reduces the influence of temperature on the absolute time. It will be appreciated that although the member may still experience expansion and thereby influence the path length between first sensor part 27 and second sensor part 29 (since first sensor part 27 is mounted on the member), this influence is much smaller than the influence temperature may have on the time by making the member of a material with a suitably low thermal expansion coefficient.

It will also be appreciated that other embodiments are possible as well, such as having a further member for mounting second sensor part 29, having only a member for second sensor part 29 and not for first sensor part 27. Also, position error sensor 25 can determine displacements of first sensor part 27 and second sensor part 29 and thus may comprise an optical encoder system or may comprise, in general, a detection signal source such as a first or second sensor part 27,29 and a detection signal detector such as the other sensor part as explained hereinbefore. Also, position error sensor 25 may have a third sensor part (not shown) which measures the distance between the member and the further member, both comprising a material with a low thermal expansion coefficient, wherein the third sensor part is located away from the member and the further member, for instance, by being mounted on frame 11 or even on another part of the lithographic apparatus or a further frame.

As mentioned before, the second measurement system which is arranged for measuring the position of substrate table 12 in the second coordinate system may be an incremental position measurement system starting from a certain starting position, i.e., a reference or zero position determined by means of a reference system as described above, and counting increments along a path from the starting position towards an actual position. By using a technique of phase capture, which is explained in more detail in Pril et al., substrate table 12 can move without any loss of accuracy with respect of knowing its position in the second coordinate system.

However, aforementioned starting position of substrate table 12 may not be well defined in case of drift within the lithographic apparatus. As a result, the position measurement performed by the second measurement system may be inaccurate. This is especially the case when there is an offset of more than half an increment.

Another situation in which the second measurement system may provide an inaccurate result is a situation in which the periodicity of the periodic structure of the grid on the grid plate has been changed, e.g., due to expansion or contraction as a result of temperature variations.

In such cases, there is a risk of making errors in positioning while switching from one measurement subsystem to another measurement subsystem, e.g., in FIG. 5, while moving from measurement of position by the second measurement subsystem with respect to grid plate 43a with grid 44a, to measurement of position by the second measurement subsystem with respect to grid plate 43b with grid 44b.

Drift may occur as a result of temperature variations in the control system. However, drifts may not only be temperature related. A drift may also be caused by relaxation of materials or deformation by external forces.

In embodiments of the invention, grid plates 13, 43a, 43b, provided with grid 14, 44a, 44b, respectively, may be connected to frame 11 such that a thermally neutral point can be defined in the plane formed by the grid 14, 44a, 44b. The thermally neutral point, which is a virtual point in space, remains unaffected in response to thermal variations, i.e. it is not affected by expansion and/or contraction of frame 11. The thermally neutral point may coincide with a neutral axis of an alignment system, e.g., neutral axis 20 of alignment system 19 as schematically depicted in FIGS. 3 and 4. In embodiments, more than one thermally neutral points may be present. Again, these thermally neutral points may coincide with neutral axes of an alignment system. For example, in case the embodiment schematically depicted in FIG. 5 is used, a first thermally neutral point may coincide with neutral axis 50 of first alignment system 49, and a second thermally neutral point may coincide with neutral axis 60 of first alignment system 59. Alternatively or additionally, the second thermally neutral point may coincide with the optical axis of projection system PS.

In an embodiment, in order to obtain a thermally neutral position, one or more of grid plates 13, 43a, 43b is connected to frame 11 by means of a number of leaf springs as connections 21 (e.g. three leaf springs), shown in FIG. 3, for example. A top view of a grid plate, denoted by reference numeral 83, provided with such an embodiment is schematically shown in FIG. 8. In this embodiment, three leaf springs 81a, 81b, 81c are used. The leaf springs 81a, 81b, 81c are positioned on grid plate 83 in a single plane around the thermally neutral point, denoted by reference numeral 85, at angles of 120 degrees with respect to each other. As mentioned earlier, the thermally neutral point is a virtual point in space. Consequently, if an opening is provided in grid plate 83, e.g., for purposes of positioning an alignment system or the like, the thermally neutral point may actually be at a position in which no grid plate 83 is present. This situation is schematically shown in FIG. 8 where a dashed circle 87 is considered as an opening in grid plate 83.

In embodiments, grid plates 13, 43a, 43b are made of a material having a low thermal expansion coefficient, e.g., with a value below 0.1*10−6 K−1 or below 2*10−8 K−1. The grid plate 13, 43a, 43b may for example comprise Zerodur™ (manufactured by Schott Glas, Hattenbergstraβe 10, 55120 Mainz, Germany).

In embodiments, frame 11 comprises a material with a high thermal conduction coefficient, e.g., with a value larger than 150 Wm−1K−1. Frame 11 may for example be made of Aluminum. Measure frame 11 may be connected with a plurality of temperature sensors, which, in an embodiment, are located at outer edges of the measure frame.

Suitable positioning of the plurality of temperature sensors with respect to frame 11 may, when the behavior of the material from which frame 11 is made with respect to temperature variations is known, enable a predicting of the behavior of frame 11 with respect to shape and size in response to temperature variations. A model so developed may be used to determine the shape and size of frame 11 in response to temperature measurements obtained by the plurality of temperature sensors. As can be seen in FIGS. 3 and 4, alignment system 19 may be connected to frame 11. Consequently, if frame 11 changes shape and/or size, the position of alignment system 19 may change as well. Aforementioned model may now be used to compensate measurement errors obtained by a change of position of alignment system 19 as a result of the change of shape and/or size of the measure frame Alternatively, or additionally, the model may be used to amend a trajectory of the substrate table to compensate for aforementioned measurement errors.

As can be seen in FIGS. 3, 4 and 5, numerous elements may be connected to frame 11. In an embodiment with first alignment system 49 and second alignment system 59, as schematically depicted in FIG. 5, movement of neutral axes 50, 60 of alignment systems 49, 59 respectively with respect to each other can be monitored by using a model as described before. If communicatively connected to a controller like controller 61 discussed with reference to FIG. 6, movement of substrate table 12 can be compensated for aforementioned variation of mutual distance between neutral axes 50, 60 of first alignment system 49 and second alignment system 59, respectively.

In a lithographic apparatus, a procedure is followed to expose a pattern on number of substrates provided subsequently. The process of movement of substrate table 12 to the starting position, and subsequent movement towards a position suitable for alignment with alignment system 49 and exposure at a position aligned by means of second alignment system 59 is referred to as substrate cycle. As the substrates are provided subsequently, the process is followed repeatedly. A drift not caused by temperature, e.g., by relaxation of materials or by deformation as a result of external forces, is generally slow. By monitoring the starting position with respect to the thermally neutral position such a non-temperature related drift may be compensated for. Drifts that are not related to temperature are generally slow, i.e., it takes numerous substrate cycles to obtain a drift exceeding half an increment. Consequently, in an embodiment, in aforementioned monitoring measurements obtained from a number of substrate cycles may be averaged to improve performance with respect to noise level.

Although specific reference may be made in this text to the use of lithographic apparatus in the manufacture of ICs, the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It will be appreciated that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A control system for controlling a support structure in a lithographic apparatus, comprising:
   a first measurement system arranged to measure, in a first coordinate system, a position of an object supported by the support structure;
   a second measurement system arranged to measure, in a second coordinate system, a position of the support structure, the first measurement system having a presumed position in the second coordinate system, wherein the second measurement system comprises a reference structure to which the second coordinate system is coupled; and
   a controller configured to:
      receive a position error signal indicative of a difference between the presumed position and an actual position of the first measurement system in the second coordinate system,
      convert a measured position of the object into a converted position of the support structure in the second coordinate system, and
      control the position of the support structure based on measurements by the second measurement system, the converted position, and the error signal to dampen relative movements between the first measurement system and the second measurement system.

2. The control system of claim 1, wherein the support structure is configured to support a patterning device.

3. The control system of claim 1, wherein the controller is arranged to control the relative position of the support structure by positioning an additional support structure in a manner dependent upon a position error signal.

4. The control system of claim 1, wherein the reference structure comprises a material with a thermal coefficient of expansion smaller than at least $0.1*10^{-6}$ $K^{-1}$.

5. The control system of claim 1, wherein the reference structure comprises a grid plate.

6. The control system of the claim 1, wherein the second measurement system comprises an encoder type sensor.

7. The control system of the claim 1, wherein the second measurement system is an incremental position measurement system.

8. The control system of the claim 7, wherein the control system further comprises a reference system arranged to provide a starting position for measurements to be performed by the incremental position measurement system.

9. The control system of the claim 1, wherein the controller is configured to receive target relative positions of the first measurement system and the support structure and is configured to control the position of the support structure in a manner dependent upon a position error signal and the target relative positions when measuring the position of the object using the first measurement system.

10. The control system of the claim 1, wherein the controller is configured to determine the actual position of the first measurement system in the second coordinate system using the presumed position and a position error signal, and is configured to determine the converted position in a manner dependent upon an actual position of the first measurement system and the measured position of the object.

11. The control system of the claim 1, wherein the second measurement system comprises a reference structure to which the second coordinate system is coupled, and wherein the first measurement system and the reference structure are supported by a frame.

12. The control system of claim 11, wherein the reference structure is supported by the frame by means of a plurality of connections such that a thermally neutral point is formed in a plane of said reference structure.

13. The control system of claim 12, wherein the connections comprise leaf springs.

14. The control system of claim 12, wherein a number of the connections equals three, and wherein the connections are positioned in a single plane around said thermally neutral point at angles of 120 degrees with respect to each other.

15. The control system of claim 12, wherein the frame comprises a material with a thermal conduction coefficient larger than 150 $Wm^{-1}$ $K^{-1}$.

16. The control system of claim 1, further comprising a position error sensor arranged to measure a distance between a first sensor part and a second sensor part.

17. The control system of claim 16 wherein the first sensor part is connected to at least one of the first measurement system and the second measurement system.

18. The control system of claim 16, wherein the second sensor part is connected to at least one of the first measurement system and the second measurement system so as to measure a distance between the first measurement system and the second measurement system.

19. The control system of claim 16, wherein the second sensor part is connected to a frame.

20. The control system of claim 18, wherein the controller comprises a dampening system constructed and arranged to dampen variations of the distance.

21. The control system of claim 16, wherein at least one of the first sensor part and the second sensor part comprises a material with a thermal expansion coefficient smaller than $0.1 \times 10^{-6}$ $K^{-1}$.

22. The control system of claim 16, wherein at least one of the first sensor part and the second sensor part comprises a material with a thermal expansion coefficient smaller than $2 \times 10^{-8}$ $K^{-1}$.

23. The control system of claim 16, wherein the position error sensor comprises an interferometer.

24. The control system of claim 16, wherein the position error sensor comprises an encoder system.

25. The control system of claim 16, wherein a position error signal generated from the position error sensor is indicative of a difference between the presumed position and an actual position of the first measurement system in the second coordinate system in at least two dimensions.

26. The control system of claim 1, wherein the first measurement system comprises an alignment sensor.

27. The control system of claim 1, wherein the first measurement system comprises a level sensor.

28. The control system of claim 1, wherein the lithographic apparatus comprises a frame and wherein one of the first and the second measurement systems is fixed to the frame.

29. The control system of claim 28, wherein the second measurement system comprises a reference structure to which the second coordinate system is coupled, wherein the reference structure is fixed to the frame.

30. The control system of claim 1, wherein the controller is further configured to:
   receive a further position error signal indicative of a difference between a presumed and an actual position of an aerial image in the second coordinate system; and
   position at least one support structure dependent upon the further position error signal.

31. The control system of claim 1, wherein the controller is further configured to receive a position error signal indicative of a difference between the presumed position and an actual position of the first measurement system in the second coordinate system, and to control the position of the support structure and/or an aerial image in a manner dependent upon the position error signal.

32. A method of controlling a support structure in a lithographic apparatus, comprising:
   (a) providing an object to a support structure arranged to support the object;
   (b) measuring a position of the object in a first coordinate system using a first measurement system;
   (c) measuring a position of the support structure in a second coordinate system, the first measurement system having a presumed position in the second coordinate system;
   (d) converting the measured position of the object into a converted position of the support structure in the second coordinate system;
   (e) receiving a position error signal indicative of a difference between the presumed position and an actual position of the first measurement system in the second coordinate system,
   (f) converting a measured position of the object into a converted position of the support structure in the second coordinate system, and
   (g) controlling the position of the support structure based on measurements by the second measurement system, the converted position, and the error signal to dampen relative movements between the first measurement system and the second measurement system.

33. The method of claim 32, wherein the first positioning comprises a relative first positioning of the support structure with respect to at least one of an aerial image and a further object.

34. The method of claim 32, wherein the first positioning is performed by positioning another support structure with respect to the measured position of the support structure.

35. The method of claims 32, wherein the first positioning is performed depending upon a position of an image plane of a projection system in the second coordinate system.

36. A computer program product embodied in a non-transitory machine-readable medium, said computer program product being encoded with instructions for performing, when executed by a processor, a method of controlling a support structure in a lithographic apparatus, said method comprising:
   (a) providing an object to a support structure arranged to support the object;
   (b) measuring a position of the object in a first coordinate system with a first measurement system;
   (c) measuring a position of the support structure in a second coordinate system, the first measurement system having a presumed position in the second coordinate system;
   (d) converting the measured position of the object into a converted position of the support structure in the second coordinate system;
   (e) receiving a position error signal indicative of a difference between the presumed position and an actual position of the first measurement system in the second coordinate system,
   (f) converting a measured position of the object into a converted position of the support structure in the second coordinate system, and
   (g) controlling the position of the support structure based on measurements by the second measurement system, the converted position, and the error signal to dampen relative movements between the first measurement system and the second measurement system.

37. The computer program product of claim 36, wherein the first positioning comprises a relative first positioning of the support structure with respect to at least one of an aerial image and a further object.

38. The computer program product of claim 36, wherein the instructions are encoded such that, when executed by the processor, the first positioning is performed in a manner that is further dependent upon a position of an image plane of a projection system in the second coordinate system.

* * * * *